United States Patent [19]

Hofmann

[11] Patent Number: 4,792,801

[45] Date of Patent: Dec. 20, 1988

[54] BROADBAND SIGNAL SPACE COUPLING DEVICE

[75] Inventor: Ruediger Hofmann, Gilching, Fed. Rep. of Germany

[73] Assignee: Siemens Aktiengesellschaft, Berlin and Munich, Fed. Rep. of Germany

[21] Appl. No.: 908,240

[22] Filed: Sep. 17, 1986

[30] Foreign Application Priority Data

Sep. 23, 1985 [DE] Fed. Rep. of Germany ....... 3533915

[51] Int. Cl.$^4$ ...................... H04Q 3/00; H03K 19/20
[52] U.S. Cl. .......................... 340/825.79; 340/825.91; 379/292; 307/241; 307/448; 307/571
[58] Field of Search ...................... 340/825.79, 825.91, 340/825.8, 826, 827; 379/292, 306, 272, 273; 307/241, 445, 448, 451, 481, 571, 576, 579; 370/58, 59, 64

[56] References Cited

U.S. PATENT DOCUMENTS

| | | | |
|---|---|---|---|
| 4,024,352 | 5/1977 | Mukaemachi et al. | 340/825.91 |
| 4,107,472 | 8/1978 | Kawanami et al. | 379/292 |
| 4,417,245 | 11/1983 | Melas et al. | 340/825.8 |
| 4,611,204 | 9/1986 | Draayer | 340/825.8 |
| 4,635,250 | 1/1987 | Georgiov | 370/58 |

FOREIGN PATENT DOCUMENTS 2431164 1/1975 Fed. Rep. of Germany .

OTHER PUBLICATIONS

"Low Power CML IC Crosspoint Switch Matrix for Space Division Digital Switching Networks", M. Sunazawa et al., IEEE Journal of Solid-State Circuits, Apr.
"Wideband Integrated Crosspoint Switch Matrix", M. Sunazawa et al., Review of the Electrical Communication Laboratories, vol. 25, Nos. 1-2, Jan.-Feb. 1977, pp. 43-51.
Pfannschmidt, "Arbeitsgeschwindigkeitsgrenzen Von Koppelnetzwerkin fur Breitband-Digitalsignale", Dissertation Braunschweig 1978, pp. 120-125.
Hasler Mitteilungen, vol. 33, No. 1, Apr. 1974, pp. 20-32.
ISS'84 Conference Papers, 23C1, FIG. 9, p. 7; 23C paper 3, pp. 1-6, May 1984, Telecommunication Switching, "State of the Art Impact on Networks and Services", Proceedings of the International Switching Symposium.

Primary Examiner—Donald J. Yusko
Attorney, Agent, or Firm—Hill, Van Santen, Steadman & Simpson

[57] ABSTRACT

In a broadband signal space switching device comprising a cross point matrix whose switching elements are respectively controlled by holding storage cells selected by cross point-associated means in two coordinate directions by selection decoders, the holding storage cells being formed by bistable D flip-flops constructed in CMOS technology whose D inputs are connected to the respective decoder output of the row decoder charged with a cross point row address and an address clock signal and whose clock inputs are connected to the corresponding decoder output of the column decoder respectively charged with a cross point column address and an address clock signal.

2 Claims, 3 Drawing Sheets

BROADBAND SIGNAL SPACE COUPLING DEVICE

BACKGROUND OF THE INVENTION

1. Field of the Invention

The present invention relates to a broadband signal switching device comprising a cross point matrix whose switching elements are respectively controlled by a cross point-associated storage cell selected in two coordinates by two selection decoders.

2. Description of the Prior Art

Recent devleopments in telecommunications technology have lead to service-integrating communications transmission and switching systems for narrow band and broadband communication services which provide light waveguides as transmission media in the area of subscriber lines by way of which both the narrow band communication services such as, in particular, 64 kbit/s digital telephony, as well as broadband communication services such as, in particular, 140 Mbit/s picture telephony, are conducted, whereby, however, narrow band signal switching devices and broadband signal switching devices (preferably comprising common control devices) are provided in the switching centers as disclosed in the German Pat. No. 24 21 002.

In conjunction with a broadband signal time-division multiplex switching device whose cross points are respectively utilized in time-division multiplex for a plurality of connections, it is known in the art to connect respectively two lines with the assistance of a gate element which is switched on and off by a cross point-associated storage cell formed by a bistable D flip-flop, whereby the cross point-associated storage cell whose clock input is supplied with a corresponding clock signal is driven in only one coordinate direction, at its D input (Pfannschmidt, "Arbeitsgeschwindigkeitsgrenzen von Koppelnetzwerken für Breitband-Digitalsignale", Dissertation Braunschweig 1978, FIG. 6.7). In view of a time-division multiplex factor of about 4–8 obtainable given a bit rate of 140 Mbit/s and in view of the involved circuit technology thereby required, however, pure space switching devices are currently preferred for switching broadband signals, the connections extending via the individual cross points being only spatially separated therein from one another.

A pure broadband signal space switching arrangement can be fashioned as a crosspoint matrix in whose cross points the switching elements are respectively controlled by a cross point-associated holding storage cell driven in two coordinates by two selection decoders, namely a row decoder and a column decoder, whereby the holding storage cells are respectively selected by row and column decoders in order to write new connections in and to cancel old connections (Pfannschmidt, Op. cit. FIG. 6.4). In such a broadband space switching device, the object of the invention is then to disclose a manner for a particularly expedient selection of the correspondingly-fashioned cross points.

SUMMARY OF THE INVENTION

The object of the present invention is to provide a broadband signal space switching device comprising a cross point matrix whose switching elements are respectively controlled by a cross point-associated storage cell which is selected in two coordinate directions by two selection decoders, namely a row decoder and a column decoder. The broadband signal space switching device is particularly characterized in that the storage cells are formed with bi-stable D flip-flops in complementary metal-oxide-semiconductor (CMOS) technology, these being selectable by two selection decoders respectively charged with a cross point line address and an address clock signal, of which the decoder respectively selecting in the one coordinate direction (row direction) has a respective decoder output conducted to the D inputs of the D flip-flops arranged in the appertaining matrix row and the respective decoder selecting the other coordinate direction (column direction) has its respective decoder output conducted to the clock inputs of the D flip-flops arranged in the appertaining matrix line (column).

In addition to the advantages of being able in a cross point matrix to respectively select cross point-associated holding cells having bistable D flip-flops in a simple manner in respectively two coordinates in order to set up a connection extending via the respective cross point, the present invention yields the further advantage of having to select the appertaining cross points in respectively only one of the two selection coordinates during connection cleardown in order to in turn release the appertaining cross point.

It should be pointed out here that the publication Hasler Mitteilungen, Vol. 33, No. 1, April 1974, pp. 20–32, particularly Page 21 and FIG. 6, discloses a broadband signal space switching device having a 2×2 cross point matrix whose switching elements are respectively controlled by a cross point associated current source circuit (biasing circuit) held in bipolar technology which is, in turn, controlled by a flip-flop (likewise maintained in bipolar technology) which is selected in two coordinates via clock and data lines, whereby positive pulses are applied to the clock and data inputs for setting the flip-flop, whereas the resetting of the flip-flop occurs on the basis of positive pulses that are supplied only to the clock input.

With a total of 52 components (diodes, bipolar transistors and resistors), however, such cross point associated control units in bipolar technique and respectively comprising a current source circuit and a flip-flop are highly involved and have a correspondingly high space requirement, this being bearable in an integration of 2×2 cross points, but placing limits on an integration of larger cross point matrices.

In comparison thereto, the present invention which is based on a direct control of the switching elements by cross point-associated holding storage cells completely avoids the expense for current source circuits to be provided between holding storage cells and switching elements and, since the holding storage cells are formed with bistable D flip-flops in CMOS technology, also yields a further reduction in the number of components required and, therefore, of the space requirement, this being correspondingly beneficial for an integration of even larger cross point matrices.

According to a feature of the invention, the storage cells can be respectively formed with two cross-coupled CMOS inverter circuits, one of which has its input connected to the appertaining decoder output of the one selection decoder via a CMOS transfer gate which, in turn, just like a further CMOS transfer gate inserted into the feedback path leading to this input of the one CMOS inverter circuit has its one input charged with the output signal of the appertaining decoder output of the other selection decoder and has its other input charged with the negated output signal of this decoder output. Such dynamically-operated storage cells not only guarantee a reliable operation of the broadband space switching device but, with only ten transistors, also have a correspondingly low space requirement, this being of particular importance for integration.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
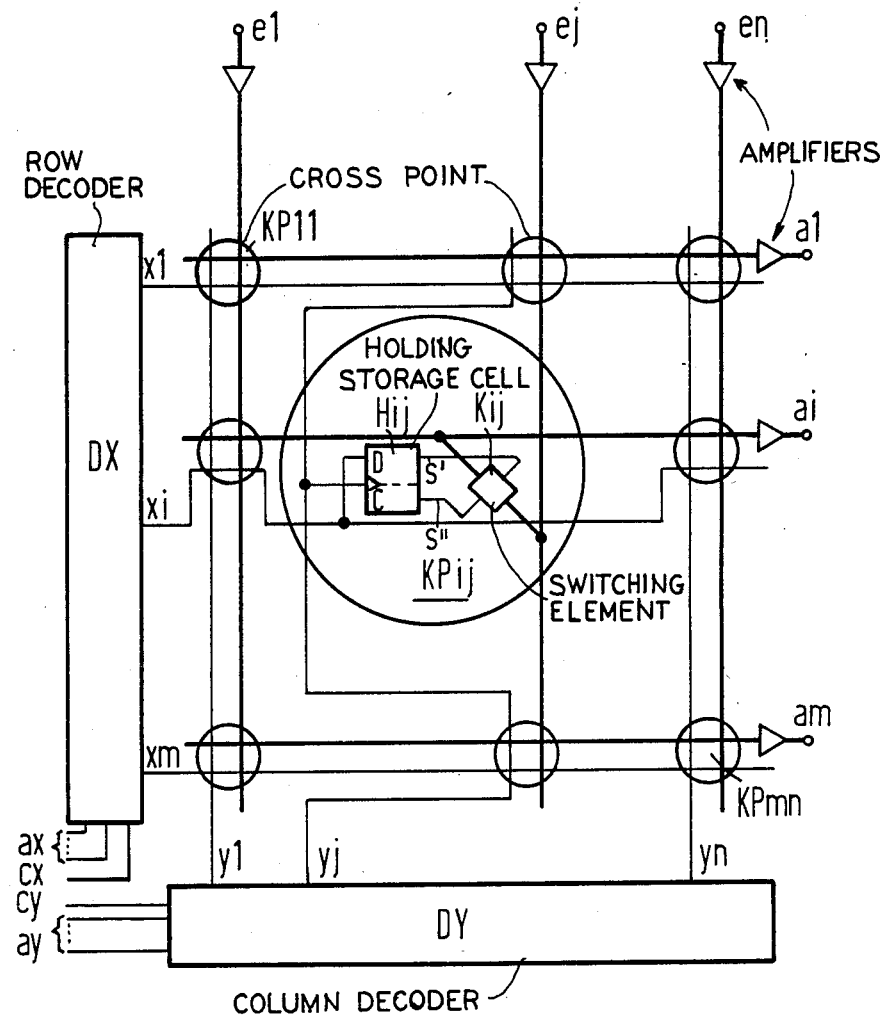
FIG. 1 is a schematic representation of a broadband switching device constructed in accordance with the present invention.

FIG. 1 of the drawings illustrates a broadband signal space switching device in the scope necessary for an understanding of the invention. This space switching device comprises a cross point matrix having cross points KP11--KPij--KPmn whose switching elements, as shown in greater detail at the cross point Kpij for the switch element Kij thereof, are respectively controlled by a cross point-associated holding storage cell Hij (at the cross point Kpij); this holding storage cell Hij being formed by a bistable D flip-flop whose two outputs s', s'' lead to corresponding control inputs of the respective switching element (Kij at the cross point Kpij).

The holding storage cells Hij are in turn selected by two selection decoders, in particular, a row decoder DX and a column decoder DY, being selected in two coordinates via corresponding selection lines xl---xi---xm; yl--yj---yn. The decoder DX selects in the row direction and thereby has its respective decoder outputs ... xi ... conducted to the D inputs of D flip-flops ... Hij ... arranged in the appertaining matrix row, in the $i^{th}$ row in the example, whereas the decoder DY selects in the column direction and has its respective decoder outputs yj conducted to the clock inputs C of the D flip-flops Hij arranged in the appertaining matrix column, for example, in the $j^{th}$ column.

As seen in FIG. 1, the two selection decoders DX, DY may be respectively chargeable via input lines ax, ay with a cross point row or, respectively, cross point column address shared by a matrix line (row or column) of cross points and may be respectively chargeable via input lines cx, cy with an address clock signal in response to which they respectively output a selection signal in a time-suited manner to the selection line corresponding to the respective cross point line address.

The coincidence of a row selection signal and of a column selection signal at the intersection of the appertaining matrix row with the appertaining matrix column during set up of a corresponding connection then effects an activation of the holding storage cell located at that cross point, for example, the holding storage cell Hij, with the result that the switching element controlled by the appertaining holding storage cell, the switching element Kij in this example, becomes conductive.

Figure 3:
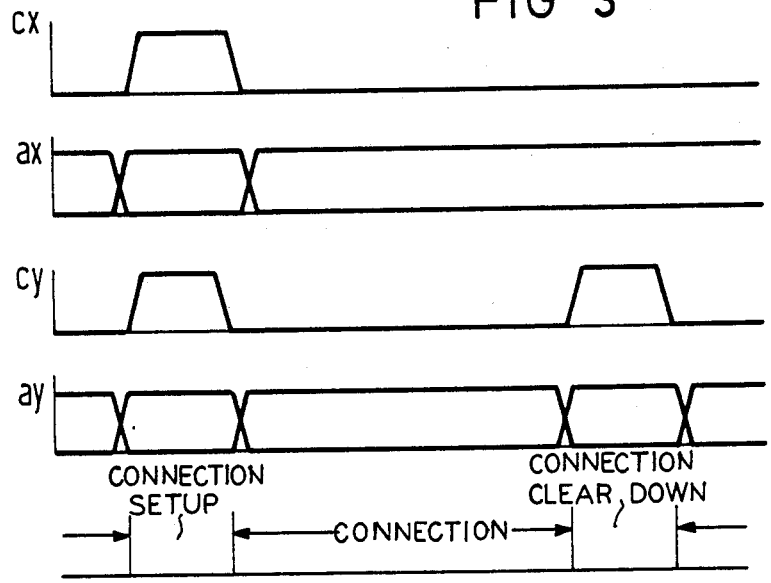
FIG. 3 is a signal status diagram.

It is abundantly clear from FIG. 3 in this respect that, for such a coincidence of a row control signal and a column control signal in a connection set up, both the row decoder DX must be charged with a row address via its input line ax (in FIG. 1) and with an address clock signal via its input line cx (in FIG. 1), as indicate in FIG. 3, line ax and cx, and the column decoder DY must be charged with a column address via its input line ay (in FIG. 1) and with an address clock signal via its input line cy (in FIG. 1). as indicated in FIG. 3, line ay and line cy.

It also is clear from FIG. 3 that, in a connection cleardown, only the column decoder DY is charged with a column address via its input lines ay and with an address clock signal via its input line cy, as indicated in FIG. 3, line ay and in FIG. 3, line cy. In order for the switching element Kij considered in the example to be inhibited again in a clear-down of the appertaining connection, in particular, the output of only a corresponding column selection signal by the column decoder DY via its selection lines yj suffices without the row decoder DX emitting a selection signal via its row selection line xi. The control signal appearing only at the clock input C of the holding storage cell Hij belonging to the cross point KPij then effects the resetting of the holding storage cell Hij with the result that the switching element Kij controlled thereby is inhibited.

For example, the switching elements Kij can thereby be respectively defined as CMOS transfer gates (CMOS transmission gates) as known for broadband signal space switching devices (for example from ISS'84 conference papers 23Cl, FIG. 9) and therefore need not be set forth in greater detail herein.

Figure 2:
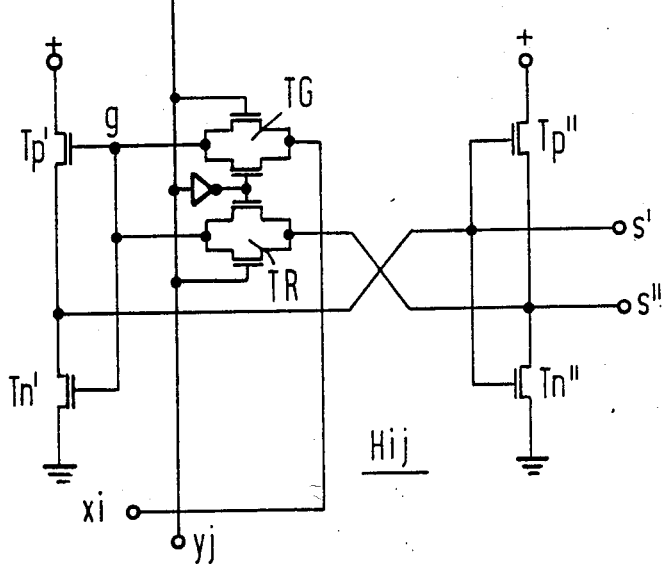
FIG. 2 is a schematic circuit diagram of the details of a cross point of FIG. 1.

As may be seen from FIG. 2, the storage cells Hij can be respectively formed with two cross-coupled CMOS inverter circuits Tp', Tn'; Tp'', Tn'' one of which has its input g connected to the appertaining decoder output, for example, the decoder output xi (in FIG. 1) of the one selection decoder (DX, of FIG. 1) via a CMOS transfer gate TG. The CMOS transfer gate TG has its one control input charged with the output signal of the appertaining decoder output, for example, of the decoder output yj (FIG. 1), of the other selection decoder (DY, FIG. 1) and has its other control input charged with the negated output signal of the decoder output (yj), and a further CMOS transfer gate TR connected into the feedback path leading to the input g of the one CMOS inverter circuit Tp', Tn' is likewise charged with the output signal at its one control input and with a negated output signal of the decoder output yj at its other control input.

Figure 4:
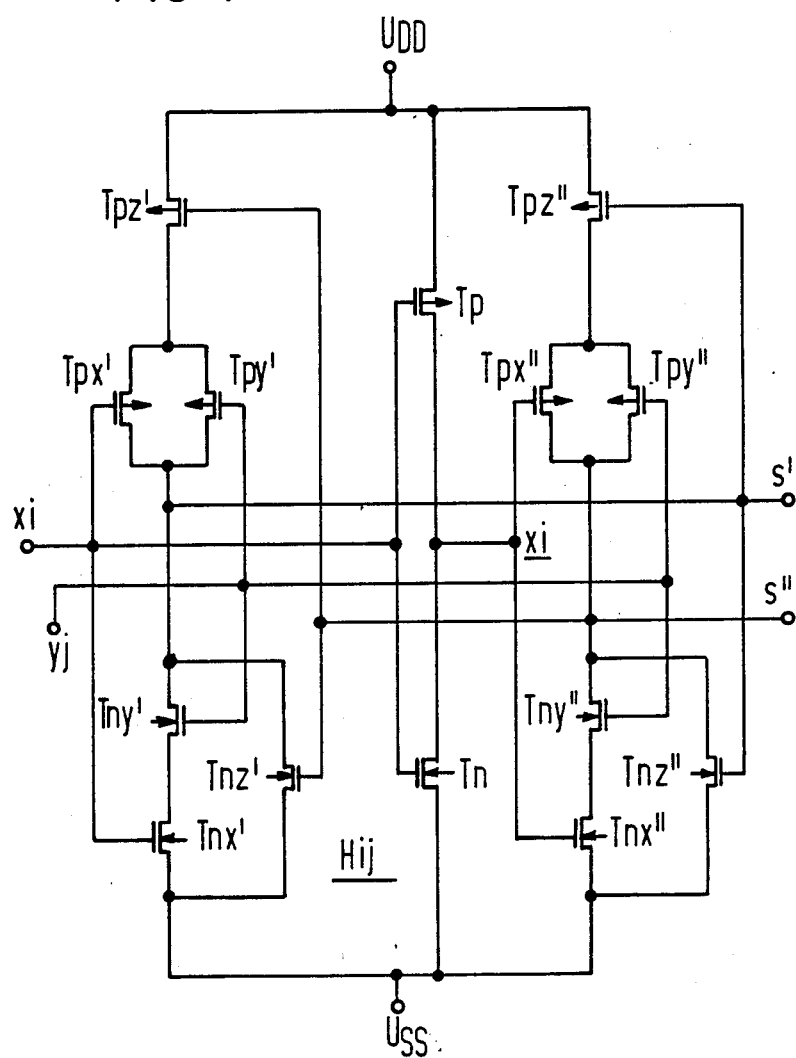
FIG. 4 is a schematic diagram illustrating details of an alternative embodiment of the invention.

In an alternative embodiment of the invention, however, it is also possible to realize the storage cells Hij in some other manner, as may be seen for example in FIG. 4. In accordance with FIG. 4, a storage cell Hij first comprises a first CMOS NAND gate Tpx', Tpy', Tnx', Tny' which has its one input xi charged with the output signal of the appertaining decoder output (xi in FIG. 1) of the one selection decoder (DX, FIG. 1) and has its other input yi charged with the output signal of the appertaining decoder output (yj in FIG. 1) of the other selection decoder (DY, of FIG. 1). An additional MOS transistor Tpz' of the same channel type is connected in series with the parallel circuit of the two MOS transistors of the one channel type contained in this CMOS NAND gate, in series with the parallel circuit of the two p-channel transistors Tpx' and Tpy' in this example. An additional MOS transistor Tnz' of the same channel type is connected in parallel to the series circuit of the two MOS transistors of the other channel type contained in the CMOS NAND gate, parallel to the series circuit of the two n-channel transistors Tnx' and Tny' in this example. Furthermore the storage cell Hij comprises a second CMOS NAND gate Tpx", Tpy", Tnx", Tny", likewise comprising an additional MOS transistor Tpz" of the same channel type connected in series with its parallel circuit of two MOS transistors Tpx",Tpy" of the one channel type and comprising an additional MOS transistor Tnz" of the same channel type connected parallel to its series circuit of two MOS transistors Tnx", Tny" of the other channel type. This second CMOS NAND gate Tpx", Tpy", Tnx", Tny" has its one input xi charged with the negated output of the appertaining decoder output (xi in FIG. 1) of the one selection decoder (DX, FIG. 1) and has its other input yj charged with the output signal of the appertaining decoder output (yj in FIG. 1) of the other selection decoder (DY, FIG. 1). As indicated in FIG. 4 for this purpose, the input xi is connected to the output of the CMOS inverter Tp, Tn whose input is interconnected to the input xi of the first CMOS NAND gate Tpx', Tpy', Tnx', Tny'.

The control electrodes of the two additional MOS transistors Tpx', Tnz' or, respectively Tpz", Tnz" of every CMOS NAND gate are respectively connected to the output S" or, respectively, S' of the respectively other CMOS NAND gate.

Although I have described my invention by reference to particular illustrative embodiments thereof many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. Broadband signal switching apparatus, comprising:
   a crosspoint matrix including intersecting column lines, row lines, column selection lines and row selection lines;
   a row selection decoder including outputs connected to said row selection lines and including a row address input and a clock input;
   a column selection decoder including outputs connected to said column selection lines and including a column address input and a clock input;
   a plurality of storage cells each located at a respective intersection and each comprising a complementary metal-oxide semiconductor (CMOS) D flip-flop which includes a D input connected to a respective row selection line, a clock input connected to a respective column selection line and an output; and
   a plurality of switches, each of said switches located at a respective intersection and connected to the respective row and column lines and connected to and operated by the output of the respective flip-flop,
   each of said storage cells comprising cross-coupled CMOS inverters, one of which has its input connected to the appertaining decoder output of the one selection decoder via a CMOS transfer gate which, in turn, like a further CMOS transfer gate inserted into the feedback path leading to this input of the one CMOS transfer inverter, has its input charged with the output signal of the appertaining decoder output of the other selection decoder and has its other input charged with the negated output signal of said decoder output.

2. Broadband signal switching apparatus, comprising:
   a crosspoint matrix including intersecting column lines, row lines, column selection lines and row selection lines;
   a row selection decoder including outputs connected to said row selection lines and including a row address input and a clock input;
   a column selection decoder including outputs connected to said column selection liens and including a column address input and a clock input;
   a plurality of storage cells each located at a respective intersection and each comprising a complementary metal-oxide semiconductor (CMOS) D flip-flop which includes a D input connected to a respective row selection line, a clock input connected to a respective column selection line and an output; and
   a plurality of switches, each of said switches located at a respective intersection and connected to the respective row and column lines and connected to and operated by the output of the respective flip-flop,
   each of said storage cells comprising a first CMOS NAND gate including a first input connected to a respective row selection line and a second input connected to the respective column selecton line of the respective intersection,
   said first CMOS NAND gate comprising an additional MOS transistor of the same channel type connected in series with the parallel circuit of two MOS transistors of the one channel type, and
   further comprising an additional MOS transistor of the same channel type connected parallel to the series circuit of the two MOS transistors of the opposite channel type,
   a first input connected to receive a negated output of the appertaining decoder and a further input connected to receive the output of the other decoder,
   said second CMOS NAND gate comprising a further MOS transistor of the same channel type connected in series with the parallel circuit of the two MOS transistors of the one channel type, and
   further comprising a furth MOS transistor of the same channel type connected in parallel to the series circuit of two MOS transistors of the other channel type, whereby the control electrodes of the two additional MOS transistors of each CMOS NAND gate are respectively connected to the output of the other CMOS NAND gate.

* * * * *